United States Patent
Richter et al.

(10) Patent No.: US 8,302,147 B2
(45) Date of Patent: Oct. 30, 2012

(54) SYSTEM AND METHOD FOR PROCESSING A COMMON CABLE SIGNAL USING A LOW-PASS FILTER TAP

(75) Inventors: Kurt J. Richter, Richardson, TX (US); Angelika Schneider, McKinney, TX (US)

(73) Assignee: CSR Technology Inc., Sunnyvale, CA (US)

( * ) Notice: Subject to any disclaimer, the term of this patent is extended or adjusted under 35 U.S.C. 154(b) by 2261 days.

(21) Appl. No.: 10/373,536

(22) Filed: Feb. 24, 2003

(65) Prior Publication Data

US 2004/0168200 A1 Aug. 26, 2004

(51) Int. Cl.
*H04N 7/173* (2011.01)
*H04N 7/16* (2011.01)

(52) U.S. Cl. ........................................ 725/149; 725/127

(58) Field of Classification Search .................. 725/127, 725/149
See application file for complete search history.

(56) References Cited

U.S. PATENT DOCUMENTS

| | | | | |
|---|---|---|---|---|
| 3,631,348 A * | 12/1971 | Lehmann | ........................ | 455/142 |
| 3,806,813 A * | 4/1974 | Eller | ............... | 725/128 |
| 4,195,202 A * | 3/1980 | McCalmont | .................... | 380/39 |
| 4,499,495 A * | 2/1985 | Strammello | ................... | 348/731 |
| 4,612,571 A * | 9/1986 | Moon | ............................ | 725/149 |
| 5,010,399 A * | 4/1991 | Goodman et al. | ......... | 348/14.01 |
| 5,218,714 A * | 6/1993 | Ishibashi et al. | ............... | 725/128 |
| 5,557,316 A * | 9/1996 | Hoarty et al. | .................. | 725/114 |
| 5,729,824 A * | 3/1998 | O'Neill et al. | ................. | 725/106 |
| 5,737,030 A * | 4/1998 | Hong et al. | ...................... | 725/41 |
| 5,737,035 A | 4/1998 | Rotzoll | ............................ | 348/725 |
| 5,793,265 A * | 8/1998 | Spielman | ........................ | 333/132 |
| 5,826,167 A * | 10/1998 | Jelinek et al. | .................. | 725/121 |
| 5,850,218 A * | 12/1998 | LaJoie et al. | ..................... | 725/45 |
| 5,898,454 A * | 4/1999 | Brickell | ........................ | 725/127 |
| 6,094,211 A * | 7/2000 | Baran et al. | ..................... | 725/125 |
| 6,177,964 B1 | 1/2001 | Birleson et al. | ............... | 348/725 |
| 6,493,543 B1 * | 12/2002 | Shin et al. | ...................... | 455/126 |
| 6,578,202 B1 * | 6/2003 | Holland | ......................... | 725/127 |
| 6,809,584 B2 * | 10/2004 | Shau | ............................. | 329/317 |
| 7,007,296 B2 * | 2/2006 | Rakib | ............................ | 725/111 |
| 2001/0011375 A1 * | 8/2001 | Yun | ................................ | 725/107 |
| 2002/0069417 A1 * | 6/2002 | Kliger et al. | .................... | 725/78 |

(Continued)

FOREIGN PATENT DOCUMENTS

GB   736874   9/1955

(Continued)

OTHER PUBLICATIONS

PCT Search Report for PCT/US2004/005318, 7 pages, Sep. 6, 2004.

*Primary Examiner* — Brian Pendleton
*Assistant Examiner* — Jonathan V Lewis
(74) *Attorney, Agent, or Firm* — Fulbright & Jaworski L.L.P.

(57) ABSTRACT

A method for processing an input signal is disclosed. The method includes receiving an input signal. The method also includes applying a first transfer function to the input signal to produce a first signal, wherein the first transfer function exhibits a high pass characteristic. The method further includes applying a second transfer function to the input signal to produce a second signal, the second transfer function exhibiting a low pass characteristic.

28 Claims, 4 Drawing Sheets

U.S. PATENT DOCUMENTS

| | | | |
|---|---|---|---|
| 2003/0093811 A1* | 5/2003 | Kaufman | 725/128 |
| 2003/0128293 A1* | 7/2003 | Lundblad et al. | 348/445 |
| 2003/0200548 A1* | 10/2003 | Baran et al. | 725/90 |
| 2004/0031064 A1 | 2/2004 | Lindstrom et al. | 725/150 |
| 2004/0068751 A1* | 4/2004 | Basawapatna et al. | 725/117 |
| 2005/0227611 A1* | 10/2005 | Ellis | 455/3.01 |
| 2007/0061854 A1* | 3/2007 | Albag et al. | 725/95 |
| 2007/0105504 A1* | 5/2007 | Vorenkamp et al. | 455/73 |
| 2009/0217325 A1* | 8/2009 | Kliger et al. | 725/78 |

FOREIGN PATENT DOCUMENTS

| | | |
|---|---|---|
| WO | WO 02/39582 A2 | 5/2002 |

\* cited by examiner

SYSTEM AND METHOD FOR PROCESSING A COMMON CABLE SIGNAL USING A LOW-PASS FILTER TAP

TECHNICAL FIELD OF THE INVENTION

This invention relates in general to cable receivers, and more particularly to a system and method for processing a common cable signal using a low-pass filter tap.

BACKGROUND OF THE INVENTION

Open Cable standards define four channels: the Forward Application Transport (FAT) channel, National Television Standards Committee (NTSC) analog channel, Forward Data Channel (FDC), and the Reverse Data Channel (RDC). The FAT and NTSC analog signals are considered in-band signals, while the FDC and RDC are considered out-of-band. In Open Cable systems, a common cable carries both the FAT and FDC signals to a receiver, such as a set-top box, that extracts signals for communication to respective tuners. To separate the signals, the set-top box typically uses a directional coupler, which imparts a signal loss of approximately 1 decibel (dB) to the FAT signal and approximately 10 dB to the FDC signal.

SUMMARY OF THE INVENTION

In accordance with the present invention, the disadvantages and problems associated with amplifying and dividing common cable channels have been substantially reduced or eliminated. In particular, certain embodiments of the present invention provide a system and method for processing a common cable signal using a low-pass filter tap.

In accordance with one embodiment of the present invention, a method for processing an input signal includes receiving an input signal. The method also includes applying a first transfer function to the input signal to produce a first signal, wherein the first transfer function exhibits a high pass characteristic. The method further includes applying a second transfer function to the input signal to produce a second signal, the second transfer function exhibiting a low pass characteristic In accordance with another embodiment of the present invention, a low-pass filter tap includes a resistor and an inductor. The resistor has a first resistor terminal and a second resistor terminal, and the first resistor terminal receives an input signal. The inductor has a first inductor terminal coupled to the second resistor terminal and a second inductor terminal. The low-pass filter tap produces an output signal comprising at least a portion of the input signal.

In another embodiment of the present invention, an integrated circuit includes an in-band tuner and an amplifier. The in-band tuner receives a first signal that includes a plurality of content channels and extracts information from a selected content channel. The amplifier receives a second signal that includes a plurality of data channels, amplifies the second signal, and communicates the second signal to an out-of-band tuner.

Particular embodiments of the present invention may include important technical advantages, some of which are enumerated below. Other technical advantages of the present invention will be readily apparent to one skilled in the art from the following figures, descriptions, and claims. Moreover, while specific advantages are enumerated here, particular embodiments may include all, some, or none of the enumerated advantages.

Important technical advantages of certain embodiments of the present invention include reducing loss to the Forward Application Transport (FAT) signal. Because the FAT signal communicates content that requires high-quality transmission, it is particularly desirable to maintain as much power as possible in the FAT signal. Certain embodiments of the present invention extract the FDC channel with significantly less loss to the overall power of the FAT signal, and in particular, significantly less loss at higher frequencies.

Other important technical advantages of certain embodiments of the present invention include adaptability to existing standards. Certain embodiments of the present invention exhibit performance characteristics in compliance with existing standards. For example, the amplifier amplifying the FDC channel may present a 75-ohm output impedance, which is compatible with out-of-band tuners commonly used in set-top boxes. Furthermore, the narrower frequency band FDC output of certain embodiments of the present invention makes it easier for amplifiers to be designed in compliance with linearity requirements.

Yet another technical advantage of certain embodiments of the present invention is providing an integrated circuit that includes both an in-band tuner and an amplifier for the FDC signal. Certain embodiments include a tuner-amplifier combination on a single integrated circuit, providing a convenient solution for manufacturing set-top boxes. Such embodiments may provide cost savings by replacing existing components that perform FDC amplification after the FDC signal is extracted.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
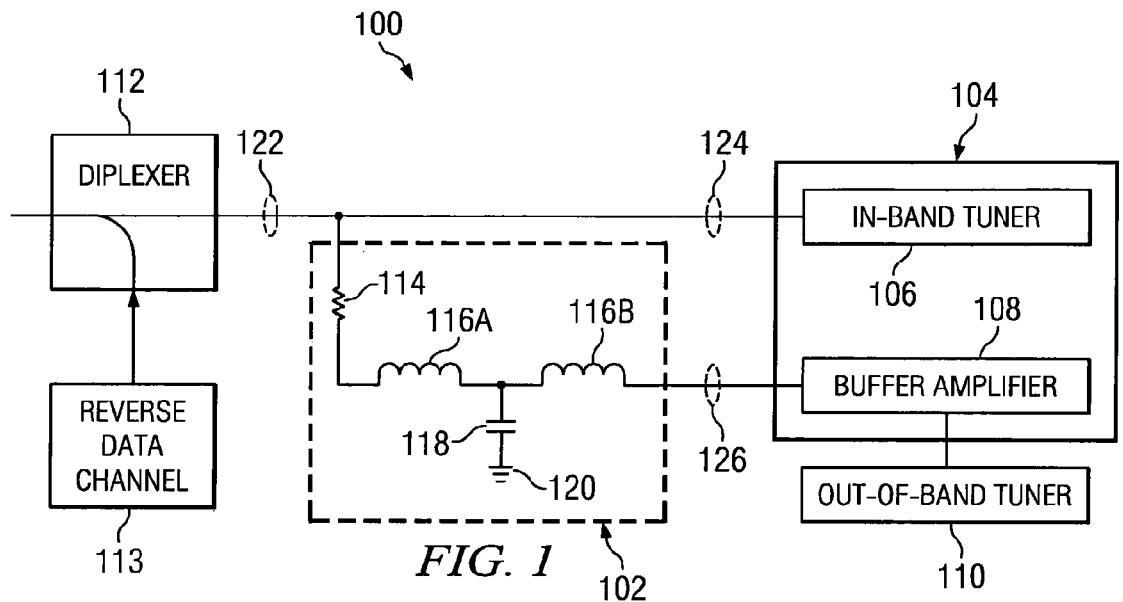
FIG. 1 illustrates a receiver in accordance with a particular embodiment of the present invention.

FIG. 1 shows a particular embodiment of a receiver 100 used, for example, in a set-top box (STB), television, personal computer, or other device to receive common cable signals 122. In the depicted embodiment, receiver 100 includes a diplexer 112 that receives signals from a reverse data channel 113, a low-pass filter tap 102, an integrated circuit 104 that includes both in-band tuner 106 and a buffer amplifier 108, and an out-of-band tuner 110. In general, low-pass filter tap 102 processes the common cable signal 122 to produce two output signals: a first output signal 124 for in-band tuner 106 and a second output signal 126 for out-of-band tuner 110. Buffer amplifier 108 amplifies the second signal 126. Tuners 106 and 110 receive signals 124 and 126, respectively, and extract appropriate information therefrom. Receiver 100 embodies improved techniques for separating signals 124 and 126 from common cable signal 122 and amplifying signal 126 for out-of-band-tuner 110.

Various cable standards specify methods for carrying both in-band content and out-of-band data within a common cable signal. Although the terms in-band and out-of-band may generally refer to particular frequency bands, the term "in-band" may also refer generically to any channel assigned to carry content signals such as digital programming. Similarly, "out-of-band" may refer generically to channels that carry information that is considered data, as differentiated from content. "Common cable signal" refers to any signal that carries both in-band and out-of-band information in the same signal.

One example of a cable standard is the Open Cable standard "Open Cable Set-top Terminal CORE Functional Requirements for Bi-Directional Cable," identified by reference number CFR-OCS-BDC-INT02-000418. In the Open Cable standard, in-band content is communicated to a set-top box (STB) in a Forward Application Transport (FAT) signal, while out-of-band data is communicated in a Forward Data Channel (FDC). Additionally, in-band signals may be communicated in National Television Standards Committee (NTSC) analog signals, so wherever the subsequent description may make references to FAT signals or FAT tuners, it should be understood that the description applies equally well to NTSC analog signals and NTSC tuners in place of, or in addition to, the associated FAT signals and tuners. The FAT signal carries cable content that includes digitized video and audio data for a large number of channels. Because customers are accustomed to a high quality level for cable content, it is desirable to preserve as much power as possible in the FAT signal to provide the highest quality of content reproduction possible at the STB. The FDC carries out-of-band data, such as program guides, menus, authorization for pay-per-view selections, and other information to the STB. It is typically less important to maintain a high level of power on the FDC. In the interest of a more comprehensive disclosure, it may be useful to note that information may also be communicated from the STB to the cable provider using a reverse data channel (RDC), such as pay-per-view orders, data communicated by a cable modem, menu selections, information request, or any other suitable data.

According to the Open Cable standard, the FAT signal is assigned to a particular frequency band, while the FDC is assigned to a narrower subrange of frequencies on the lower end of the frequency band assigned to the FAT signal. Existing systems use a directional coupler to separate the FAT signal from the FDC. A directional coupler is a splitter that divides the signal into two signals with unequal power. The power loss resulting from splitting the signal is substantially equal across all frequencies. A typical directional coupler imparts a loss of approximately 1 decibel (dB) loss to all frequencies on the signal that is eventually provided to a FAT tuner, and a loss of approximately 10 dB to the signal that is eventually provided to an FDC tuner. One disadvantage to such methods is that the power used to communicate the high-frequency components of the common cable signal to the FDC tuner is wasted, since the FDC tuner does not tune to frequencies outside of the FDC band. Furthermore, this wasted power also represents a loss to the available power of the higher-frequency channels in the FAT signal provided to the FAT tuner, which may contribute to lower-quality reproduction of the content stored in the FAT signal. The Open Cable standard, using FAT for content and FDC for data, is one of many possible techniques for communicating data and content in a common cable signal, and the selection of this particular example should not be taken to exclude other suitable standards from the following description.

Receiver 100 provides significant advantages over existing receivers used in STBs, televisions, personal computers and other devices receiving cable signals. Receiver 100 uses a low-pass filter tap 102 to extract from common cable signal 122 a first signal 124 that is communicated to in-band tuner 106 and a second signal 126 that is communicated to out-of-band tuner 110. Receiver 100 uses signal power more efficiently by allocating more power to the higher frequency ranges primarily used by in-band tuner 106 on the in-band path and more power to the lower frequencies used by out-of-band tuner 110 on the out-of-band path. In addition, the use of low-pass filter tap 102 to extract signal 122 presents significant cost advantages over directional couplers.

Diplexer 112 comprises one or more components used to receive common cable signals from a cable provider. Diplexer 112 may include any suitable collection of active and/or passive components for receiving common cable signal 122 and communicating the signal to tap 102. Diplexer 112 also receives signals from reverse data channel 113 for communication back to the cable provider. One important consideration in the design of receiver 100 is limiting the ratio of power reflected from tap 102 back to diplexer 112 as compared to the input power of common cable signal 122, a quantity known as "return loss." Various cable standards specify a maximum allowable return loss in terms of the original signal power. For example, a particular standard might mandate a return loss better than 10 dB.

Low-pass filter tap 102 includes a resistor 114, inductors 116A and 116B, and a shunt capacitor 118. In combination with the other components of low-pass filter tap 102, resistor 114 selectively extracts at least a portion of signal 122 so the lower frequencies are selectively communicated on the out-of-band path, while the higher frequency components are relatively attenuated. The resistance value of resistor 114 may be selected to keep the noise introduced into out-of-band signal 126 below a predetermined level.

Inductors 116A and 118B have inductance values according to the desired frequency band, but other design considerations may be taken into account in the selection of inductance values. For example, the values of inductors 116A and/or 116B may be selected to control the amount of return loss. Although the depicted embodiment includes two inductors 116A and 116B, low-pass filter tap 102 may include more or fewer inductors as needed or desired.

Shunt capacitor 118 appears as a short to ground 120 for high frequency signals. The effect of capacitor 118 is to attenuate the signal level above a certain frequency, thus narrowing the frequency band of output signal 126 from tap 102. Other considerations, such as return loss, may also be considered in determining the value of capacitor 118.

The narrower frequency band of signal 126 communicated to amplifier 108 has some technical advantages. First, it prevents power used to amplify out-of-band signal 126 from being wasted on extraneous frequencies not detected by out-of-band tuner 110. Second, it reduces the range of frequencies to which amplifier 108 must respond. This is advantageous because certain standards require amplifier 108 to respond with a certain degree of linearity over the entire range of amplified frequencies, and such linearity is easier to provide over a narrower frequency band.

The depicted embodiment of low-pass filter tap 102 is only one of many possible embodiments, using any combination of resistors, inductors, capacitors, or other suitable electronic components. One important characteristic of low-pass filter tap 102 is the frequency-selective tapping function performed by resistor 114, inductors 116A and 116B, and capacitor 118. While low-pass filters may be used in conjunction with the directional coupler of existing systems to narrow the frequency band presented to amplifier 108 for the reasons discussed above, the power removed from the signal at higher frequencies is wasted. By contrast, tap 102 selectively extracts frequencies, thus conserving signal power in the higher frequencies of the in-band range.

Integrated circuit 104 comprises a silicon chip that includes in-band tuner 106 and buffer amplifier 108. Existing systems provide in-band tuners on integrated circuits that receive signals from directional couplers, but such systems require separate off-chip hardware to amplify the output of the directional coupler so that the out-of-band signal may be provided to an out-of-band tuner. One advantage of receiver 100 is that receiver 100 provides an integrated solution that efficiently processes input signal 122 into in-band signal 124 and out-of-band signal 126. This allows receiver 100 to function with conventional out-of-band tuners 110 without requiring any off-chip hardware to amplify the output signal for out-of-band tuner 110.

In-band tuner 106 comprises any suitable component or components for extracting information from a particular channel within the in-band signal. Particular embodiments of in-band tuners 106 use components such as upconverters, downconverters, attenuators, amplifiers, demodulators, or other suitable electronic components.

Buffer amplifier 108 comprises any suitable hardware and/or software for amplifying out-of-band signal 126 for presentation to out-of-band tuner 110. In the depicted embodiment, buffer amplifier 108 is fabricated on a silicon chip 104 with in-band tuner 106. In terms of performance, buffer amplifier 108 may meet certain requirements in order to comply with various standards. Various considerations in the design of amplifier 108 include noise figure, reverse isolation, linearity, gain, and other suitable considerations.

Another consideration is reverse isolation of amplifier 108. Oscillators used in out-of-band tuner 110 may produce a signal that bleeds back through amplifier 108. Reverse isolation refers to attenuating the bleed-back signal to prevent interference with other signals in receiver 100. Directional couplers provide some reverse isolation naturally, but low-pass filter tap 102 generally provides less reverse isolation than a typical directional coupler. As a result, tap 102 and amplifier 108 may include values that are selected to reverse-isolate out-of-band tuner 110.

Out-of-band tuner 110 comprises any suitable component for extracting information from channels within the frequency range of the out-of-band signal. Out-of-band tuner 110 may include any suitable electronic components, including those used in in-band tuner 106, and may be selected from any of a wide variety of standard parts used in receivers in conjunction with directional couplers and amplifying hardware. One advantage of certain embodiments of receiver 100 is providing out-of-band tuner 110 with a clear signal 126 due to efficient power use from the use of low-pass filter tap 102. This reduces the chance that the out-of-band tuner 110 will distort the output from out-of-band signal 126, lose information, or otherwise fail to properly extract information from the out-of-band signal.

In operation, diplexer 112 exchanges information with a cable provider by receiving common cable signals 122 (including in-band and out-of-band information) and communicating RDC signals 113 back to the cable provider. Diplexer 112 communicates common cable signal 122 to low-pass filter tap 102. Low-pass filter tap 102 selectively draws low frequency components of common cable signal 122 into signal 126 communicated to buffer amplifier 108.

Signal 124, which represents the remaining portion of common cable signal 122 after signal 126 is drawn off, continues to in-band tuner 106. Signal 124 is somewhat attenuated in the lower frequency range because of the power drain caused by extracting signal 126 from common cable signal 122. However, at high frequencies, relatively little loss is imparted to signal 124 as a result of the extraction of signal 126. Thus, the power in common cable signal 122 is efficiently preserved for a significant portion of the in-band frequencies. This enables in-band tuner 106 to more effectively extract content from in-band channels.

Performance metrics for receiver 100 may vary depending on the particular type, values, and arrangement of the components of receiver 100, and design choices may be affected by industry standards, cost considerations, intended use and a variety of other considerations. For the sake of providing a benchmark, the following example is presented, but it should be understood that this embodiment is only one of many possible examples. In a particular embodiment, resistor 114 has R=100 ohms, inductor 116A has L=560 nH, inductor 116B has L=270 nH, and capacitor 118 has C=3 pF.

Figure 2:
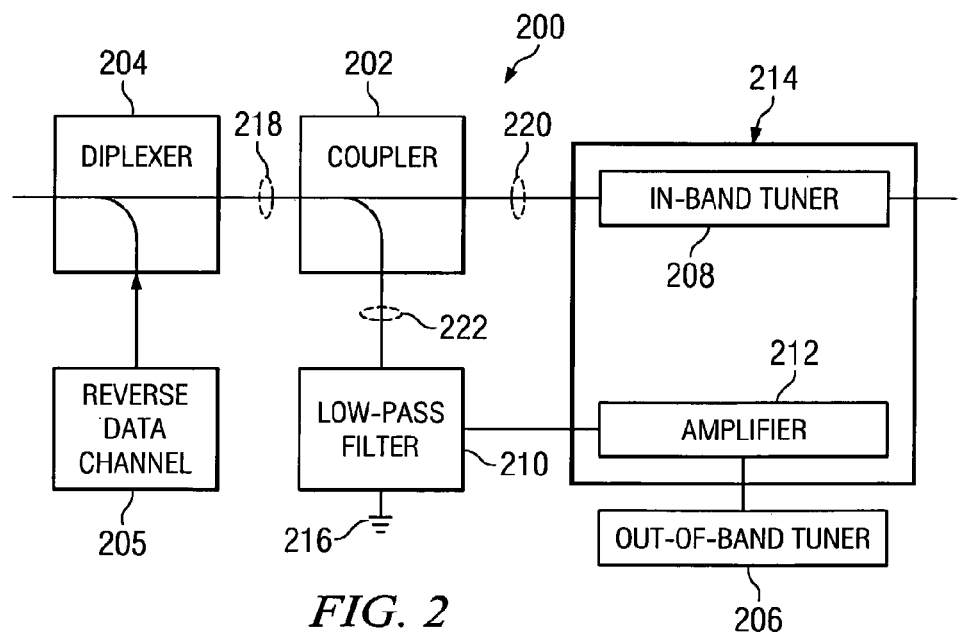
FIG. 2 illustrates a receiver in accordance with another embodiment of the present invention.

FIG. 2 shows another embodiment of receiver 200 that uses a directional coupler 202 in place of low-pass filter tap 102. Diplexer 204, reverse data channel 205, out-of-band tuner 206, and in-band tuner 208 represent the same components as the like components shown in FIG. 1. The differences are in low-pass filter 210 and amplifier 212 in integrated circuit 214. Because directional coupler 202 is used, low-pass filter 210 does not require a resistor. Instead, low-pass filter 210 uses inductors, capacitors, and any other suitable components to attenuate the component of the signal outside of the desired frequency band for out-of-band tuner 206. Unlike low-pass filter tap 102 of FIG. 1, coupler 202 does not preserve the power at higher frequencies in the in-band signal 124.

Directional coupler 202 divides a common cable signal 218 into a first signal 220 for in-band tuner 208 and a second signal 222 for out-of-band tuner 206. Because the quality of in-band signals is more likely to be degraded by insufficient power than out-of-band signals, directional coupler 202 provides most of the power to first signal 220 (typically 1 dB less than common cable signal 218) and less power to second signal 222 (typically 10 dB less than common cable signal 218). The loss imparted by coupler 202 is essentially uniform across all frequencies in both paths.

Amplifier 212 may have different characteristics than amplifier 108. However, amplifier 212 may also be suitably designed to be compatible with low-pass filter tap 102. This provides advantageous versatility for the component, since integrated circuit 214 may then be incorporated into receivers that use either directional couplers 202 or low-pass filter taps 102. Even without adapting amplifier 212 for use with both directional couplers 202 and low-pass filter taps 102, integrated circuit 214 that includes in-band tuner 208 and amplifier 212 still provides advantages by reducing the number of components required to provide an amplified signal to out-of-band tuner 206 and by reducing the overall amount of space and cost required for a set-top box receiver.

Figure 3:
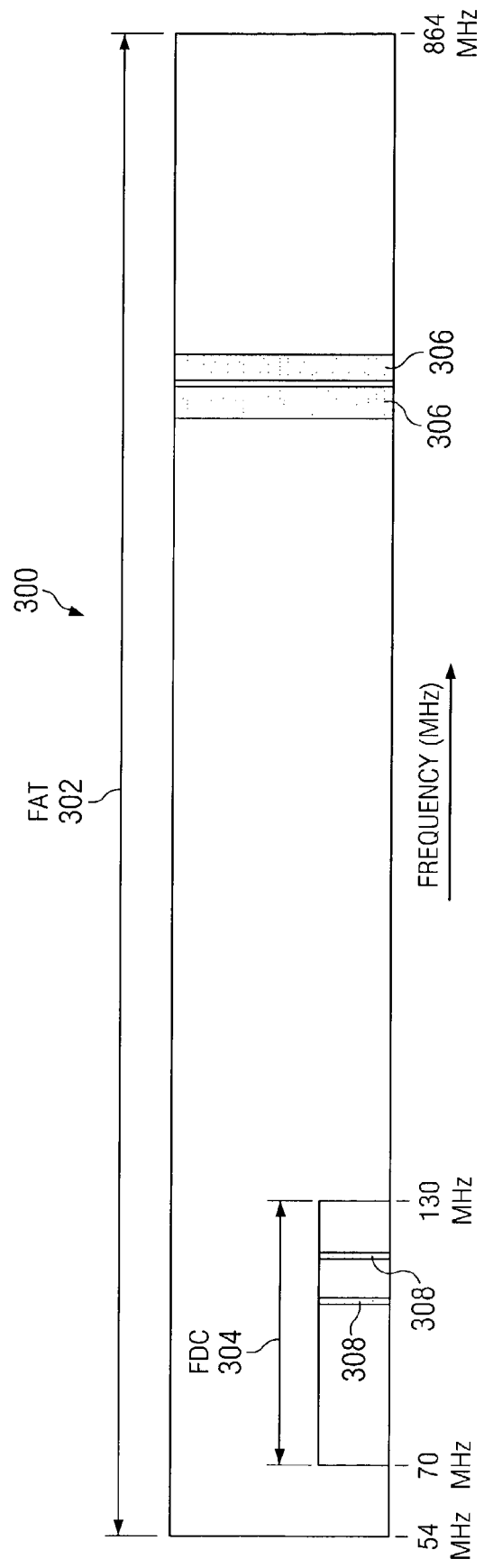
FIG. 3 is a frequency spectrum illustrating Forward Application Transport (FAT) and Forward Data Channel (FDC) frequency bands and channels.

FIG. 3 shows a frequency spectrum 300 according to the Open Cable specification. The FAT band 302 encompasses a nominal frequency range from 54 MHz to 864 MHz. Within the FAT band 302, the FDC band 304 is permitted within the range of 70 to 130 MHz. As might be expected, channels 306 for FAT communication require a larger bandwidth in order to guarantee the continuous delivery of large amounts of visual and audio information. Consequently, FAT channels 306 have a bandwidth of 6 MHz. In-band tuner 106 or 208 requires a relatively high power level in order to capture all of the content in a channel accurately. In general, the higher the power level, the more effective in-band tuner 106 will be at performing its task.

By contrast, the FDC channels 308 carry less information and require less bandwidth. FDC channels 308 are easier to detect, and can be distinguished more readily at a lower power level. However, because FDC information may be extremely sensitive to the loss of any relevant data, it is important that the power is sufficient to allow a high degree of accuracy in extracting information from FDC channels. In a particular embodiment, receiver 100 serves both purposes by drawing off sufficient power for the FDC signal at low frequencies while limiting the reduction in power level for high frequency signals in the FAT signal.

Figure 4:
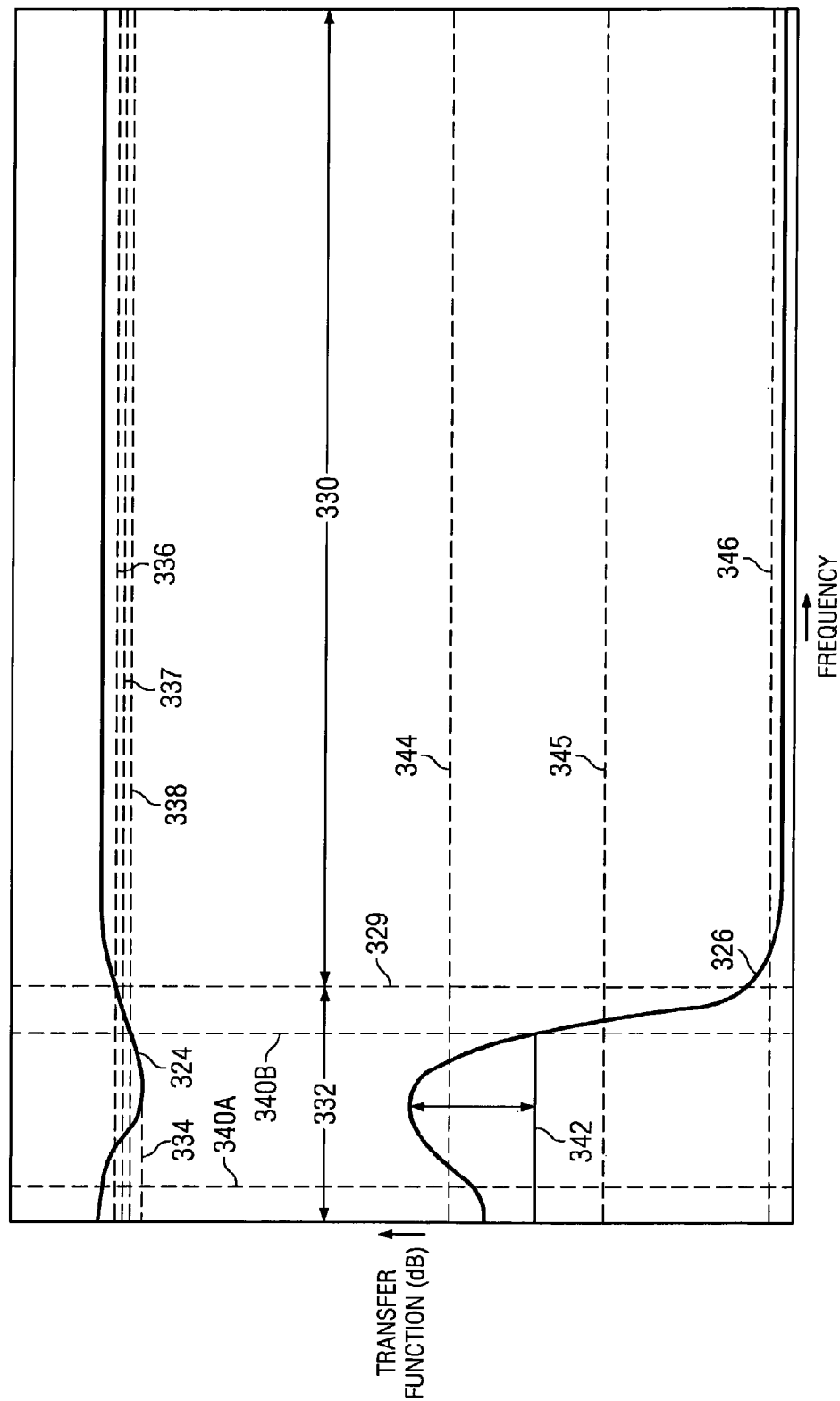
FIG. 4 is a diagram of transfer functions applied to an input signal by the receiver of FIG. 1, plotted as a function of frequency.

FIG. 4 is a diagram that illustrates the transfer functions 324 and 326 of low-pass filter tap 102 with respect to signals 124 and 126, respectively, and input signal 122 plotted as a function of frequency. The transfer function represents the ratio of the power of the respective output signal to the power of the input signal plotted as a function of frequency. Thus, the value of the transfer function at any point represents the ratio of the output power to the input power at a particular frequency. The curves are approximations intended to illustrate the general relationship of each signal's transfer function versus frequency, rather than to illustrate a precise numerical or mathematical relationship.

For ease in describing the behavior of signals 124 and 126 at high and low frequencies, a cutoff frequency 328 may be defined to separate two frequency ranges: a high-frequency range 330 above cutoff frequency 328 and a low-frequency range 332 below cutoff frequency 328. Cutoff frequency 328 may represent any selected frequency relevant to assessing the power characteristics of signals 124 and 126, and may include a characteristic cutoff frequency for low-pass filter tap 102, a defined degree of attenuation for signal 126, or any other suitable frequency.

The characteristics of the transfer function 324 for tap 102 with respect to first signal 124 and input signal 122 may be described in various ways. Generally, transfer function 324 exhibits a high pass characteristic, so that a greater degree of attenuation is imparted to low-frequency channels than high-frequency channels. For purposes of quantifying the degree of attenuation, the minimum value 334 of transfer function 324 may be useful for comparing the signal 124 to a comparable output signal 220 produced by directional coupler 202. In particular embodiments of receiver 100, minimum value 334 may be comparable to the uniform value of the transfer function of directional coupler 202 with respect to output signal 220.

It may also be useful to consider the average values of transfer function 324 in frequency ranges 330 and 332. Average values of transfer function 324 may be calculated using any suitable technique, such as integrating over the frequency range and dividing by the width of the frequency range. In high-frequency range 330, the average value 336 of transfer function 324 is close to zero dB (no attenuation), and may advantageously be significantly higher than the corresponding uniform value of the transfer function of directional coupler 202 with respect to signal 220. In low-frequency range 332, the average value 338 of transfer function 324 is lower than the average value 336 in high-frequency range 330 and the average value 337 across all frequencies of signal 124, but may advantageously be higher than the uniform value of the transfer function of directional coupler 202 with respect to signal 220. Thus, receiver 100 may provide a significantly higher transfer function for channels in high-frequency range 330 as compared to directional coupler 202, as well as a comparable or higher transfer function for channels in low-frequency range 332.

Characteristics of the transfer function 326 for tap 102 with respect to second signal 126 and input signal 122 may be similarly described. Generally, transfer function 326 exhibits a low pass characteristic, so that a greater degree of attenuation is applied to high frequencies than low frequencies. Of particular interest is the fact that tap 102 imparts a significantly greater degree of attenuation to frequencies outside of a desired frequency band from which out-of-band tuner 110 extracts channels. Diagram 320 illustrates the frequency range assigned to out-of-band signals, indicated by boundary lines 340A and 340B. The minimum value 342 of the transfer function in the out-of-band frequency range provides a useful indication for determining whether out-of-band tuner 110 will have sufficient power to extract information from all channels in the out-of-band range. Minimum value 342 may also be used to compare the transfer function to that of the corresponding output signal 222 from directional coupler 202.

Average values 344 and 346 may also be determined for transfer function 326 in low-frequency range 332 and high-frequency range 330, respectively, and an average value 345 for the transfer function over all frequencies of signal 126 may also be determined. Comparing average value 344 at low frequencies to average value 346 at high frequencies and/or overall average value 345 provides a useful indication of the relative effectiveness of tap 102 at isolating the relevant frequencies that are useful to out-of-band tuner 110. Average value 344 may also be compared to the value of the transfer function for a corresponding output signal 222 of directional coupler 202, thus providing some indication of the relative effectiveness of tap 102 as compared to directional coupler 202.

The depicted diagram 320 is only one example of numerous possible ways of characterizing the output signals 124 and 126 generated by tap 102. Particular performance advantages of tap 102 relative to directional coupler 102 need not be present in all embodiments, and are included only for the purpose of illustration. Various embodiments may produce signals 124 and 126 with different transfer functions, different relationships between transfer function and frequency, and different absolute, average, and relative transfer functions. In particular, the characteristic values of the transfer function of signals 124 and 126 in high-frequency range 330 and low-frequency range 332 may vary greatly depending on the particular embodiment selected. Consequently, the relationships depicted in diagram 320 should be viewed as particular examples of some of the numerous possible examples of the transfer function relationship between signals 122, 124, and 126. Furthermore, although the use of tap 102 has been described as one technique for producing transfer functions with desired characteristics, such as having a higher average value 344 in low-frequency range 332 for signal 126, the use of this particular example need not exclude the use of other techniques for applying transfer functions with similar characteristics.

Figure 5:
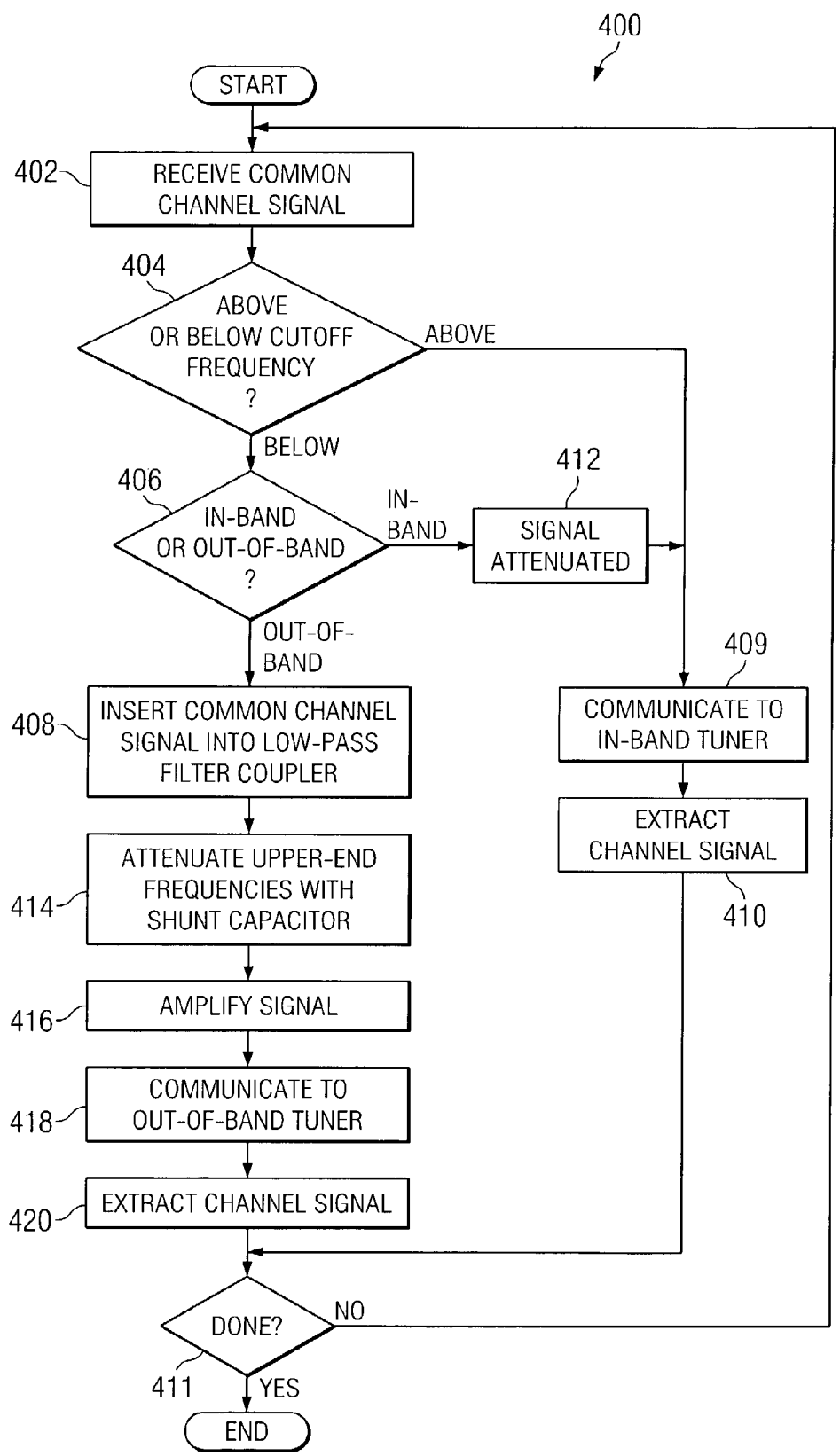
FIG. 5 is a flow chart illustrating one example of a method of channel processing in the receiver of FIG. 1.

FIG. 5 is a flowchart illustrating the processing a particular channel associated with in-band signal 124 or out-of-band signal 126. Receiver 100 receives common cable signal 122 that includes the particular channel using diplexer 112 at step 402. What happens to the particular channel next is determined by the frequency of the channel in relation to a cutoff frequency, as shown in decision step 404. The cutoff frequency is defined as the frequency beyond which the attenuation in in-band signal 124 is not considered significant, which may be a particular level of attenuation, a percentage variation below a certain threshold, or any other suitable metric beyond which in-band signal 124 is not considered to be attenuated.

If the channel frequency is above the cutoff frequency, meaning that the channel is an in-band channel, the channel is communicated in signal 124 to in-band tuner 106 without substantial attenuation at step 409. In-band tuner 106 then extracts information the channel at step 410. The method then repeats for that channel from step 402 for as long as information continues to be transmitted on the channel, as shown by decision step 411.

If the channel frequency is below the cutoff frequency, then what happens to the channel will depend on whether the channel is an in-band channel or an out-of-band channel, as shown by decision step 406. If the channel is an in-band channel, the channel is attenuated at step 412 due to a portion of common cable signal 122 being drawn off by low-pass filter tap 102. The attenuated channel is then communicated to in-band tuner 106 as part of signal 124 at step 409, and in-band tuner 106 extracts information from the channel at step 410. The method then repeats from step 402 as long as information continues to be transmitted on the channel.

If the channel is an out-of-band channel, then the channel inserted into low-pass filter tap 102 as part of signal 126 at step 408. Capacitor 118 attenuates extraneous high-frequency components of signal 126 at step 414. Amplifier 108 then amplifies signal 126, including the out-of-band channel, at step 416, and communicates signal 126 to out-of-band tuner 110 at step 418. Out-of-band tuner 110 extracts information from the channel at step 420, and the method repeats from step 402 as long as information continues to be transmitted on the channel.

The described method of operation is only one example of numerous possible embodiments. Particular steps may be omitted, added, or performed in a different order, and the method may be performed using different components or in a different device than the one described. In particular, the described method does not exclude any other method of operation or technique consistent with those described above in conjunction with any other embodiments.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for processing an input signal, comprising:
   receiving an input signal comprising in-band information and out-of-band information;
   applying a first transfer function to the in-band information to produce a first signal comprising in-band channel content, the first transfer function exhibiting a high pass characteristic; and
   applying a second transfer function to the out-of-band information to produce a second signal comprising out-of-band data information, the second transfer function exhibiting a low pass characteristic.

2. The method of claim 1, wherein the first and second transfer functions are applied by a low-pass filter tap comprising at least one resistor.

3. The method of claim 1, further comprising amplifying the second signal.

4. The method of claim 1, further comprising:
   communicating the first signal to a first tuner; and
   communicating the second signal to a second tuner.

5. The method of claim 4, wherein the first tuner is an in-band tuner and the second tuner is an out-of-band tuner.

6. The method of claim 1, wherein:
   the first transfer function is characterized by a lower average value in a first frequency band than the average value over all other frequencies in the first signal; and
   the second transfer function is characterized by a higher average value in the first frequency band than the average value over all other frequencies in the second signal.

7. The method of claim 6, wherein:
   the input signal is a common cable signal;
   the first frequency band is assigned to data channels; and
   the second frequency band is assigned to content channels.

8. The method of claim 6, wherein at least portions of the first and second frequency bands overlap.

9. The method of claim 6, further comprising attenuating frequencies above the first frequency band in the second signal using a shunt capacitor.

10. A low-pass filter tap, comprising:
    a resistor having a first resistor terminal and a second resistor terminal; and
    an inductor comprising a first inductor terminal coupled to the second resistor terminal and a second inductor terminal;
    wherein the low-pass filter tap receives an input signal and produces a first output signal comprising a first portion of the input signal comprising an out-of-band signal which includes data information corresponding to audio/video content present in the input signal and produces a second output signal comprising a second portion of the input signal comprising in-band data.

11. The low-pass filter tap of claim 10, wherein the resistor receives the input signal at the first resistor terminal.

12. The low-pass filter tap of claim 10, wherein the inductor receives the input signal at the second inductor terminal.

13. The low-pass filter tap of claim 10, further comprising a second inductor coupled to the second inductor terminal.

14. The low-pass filter tap of claim 10, further comprising a shunt capacitor coupled to the second inductor terminal and to ground, the shunt capacitor operable to attenuate a high-frequency component of the output signal.

15. The low-pass filter tap of claim 10, further comprising a second inductor coupled to the first resistor terminal.

16. The low-pass filter tap of claim 10, further comprising a shunt capacitor coupled to the first resistor terminal and to ground, the shunt capacitor operable to attenuate a high-frequency component of the output signal.

17. The low-pass filter tap of claim 10, wherein:
    the output signal is a first output signal comprising a first portion of the input signal; and
    the low-pass filter tap produces a second output signal comprising a second portion of the input signal.

18. The low-pass filter tap of claim 10, wherein the low-pass filter tap is operable to apply a first transfer function and a second transfer function to the input signal, wherein the first transfer function exhibits a high pass characteristic and the second transfer function exhibits a low pass characteristic.

19. The low-pass filter tap of claim 10, wherein:
    the low-pass filter tap is operable to apply a first transfer function and a second transfer function to the input signal;

the first transfer function is characterized by a lower average value in a first frequency band than the average value over all other frequencies in the first signal; and the second transfer function is characterized by a higher average value in the first frequency band than the average value over all other frequencies in the second signal.

20. An apparatus, comprising:
a low-pass filter tap comprising at least one resistor, at least one inductor, and at least one capacitor, the low-pass filter tap operable to apply a first transfer function to a first portion of an input signal to produce a first signal comprising content and further operable to apply a second transfer function to a second portion of the input signal to produce a second signal comprising out-of-band data information, wherein the first transfer function exhibits a high pass characteristic and the second transfer function exhibits a low pass characteristic;
an integrated circuit, comprising:
   an in-band tuner operable to receive the first signal and to extract content from a selected channel of the second signal; and
   an amplifier operable to amplify the second signal and further operable to communicate the second signal to an out-of-band tuner.

21. The apparatus of claim 20, wherein:
the first transfer function is characterized by a lower average value in a first frequency band than the average value over all other frequencies in the first signal; and
the second transfer function is characterized by a higher average value in the first frequency band than the average value over all other frequencies in the second signal.

22. The apparatus of claim 21, wherein:
the first frequency band is a frequency band assigned to data channels;
the input signal further comprises a second frequency band assigned to content channels; and
at least portions of the first and second frequency bands overlap.

23. The method of claim 1 wherein said second signal comprising out-of-band data information includes information from a Forward Data Channel.

24. The method of claim 23 wherein said first signal comprising in-band content includes information from at least one of a Forward Application Transport channel and a National Television Standards Committee channel.

25. The method of claim 1 wherein said in-band channel content comprises audio/video content.

26. The method of claim 25 wherein said out-of-band data comprises information corresponding to said audio/video content.

27. A method for processing an input signal, comprising:
receiving an input signal;
applying a first transfer function to the input signal to produce a first signal comprising in-band channel content, the first transfer function exhibiting a high pass characteristic; and
applying a second transfer function to the first signal to produce a second signal comprising out-of-band data information, the second transfer function exhibiting a low pass characteristic.

28. A method for processing an input signal, comprising:
receiving an input signal;
applying a first transfer function to the input signal to produce a first signal comprising out-of-band data information, the first transfer function exhibiting a low pass characteristic; and
applying a second transfer function to the first signal to produce a second signal comprising in-band channel content, the second transfer function exhibiting a high pass characteristic.

* * * * *